United States Patent
Chi et al.

[11] Patent Number: 6,090,719
[45] Date of Patent: Jul. 18, 2000

[54] DRY ETCHING METHOD FOR MULTILAYER FILM

[75] Inventors: Sung-Hun Chi, Seoul; Jae-Hee Ha, Cheongju, both of Rep. of Korea

[73] Assignee: LG Semicon Co., Ltd., Cheongju, Rep. of Korea

[21] Appl. No.: 09/071,835

[22] Filed: May 4, 1998

[30] Foreign Application Priority Data

Jan. 9, 1998 [KR] Rep. of Korea ............... 98-364

[51] Int. Cl.[7] .................................. H01L 21/302
[52] U.S. Cl. .................. 438/719; 438/721; 438/738; 438/733
[58] Field of Search .................. 216/2, 58, 67, 216/69, 70; 438/706, 719, 721, 723, 738, 743, 733, 714

[56] References Cited

U.S. PATENT DOCUMENTS

| | | | |
|---|---|---|---|
| 4,376,672 | 3/1983 | Wang et al. | 156/643 |
| 4,734,157 | 3/1988 | Carbaugh et al. | 156/643 |
| 5,078,833 | 1/1992 | Kadomura | 156/643 |
| 5,112,435 | 5/1992 | Wang et al. | 156/643 |
| 5,160,407 | 11/1992 | Latchford et al. | 156/656 |
| 5,219,485 | 6/1993 | Wang et al. | 252/79.3 |
| 5,726,102 | 3/1998 | Lo | 438/718 |

FOREIGN PATENT DOCUMENTS

| | | |
|---|---|---|
| 8-83788 | 3/1996 | Japan . |
| 08162442 | 6/1996 | Japan . |
| 8-162442 | 6/1996 | Japan . |
| WO 87/06027 | 10/1987 | WIPO ............... G03F 1/00 |

OTHER PUBLICATIONS

Derwent abstract—NL 8302035 A, Jan. 2, 1985.
Derwent abstract—JP 08083756 A, Mar. 26, 1996.
Derwent abstract—JP 0816442 A, Jun. 21, 1996.
Derwent abstract—JP 02244625 A, Sep. 28, 1990.
Derwent abstract—JP 08083788 A, Mar. 26, 1996.

*Primary Examiner*—Yogendra Gupta
*Assistant Examiner*—Dawn L. Garrett
*Attorney, Agent, or Firm*—Fleshner & Kim

[57] ABSTRACT

A dry etching method for a multilayer film is disclosed, which is capable of dry-etching a multilayer film such as a titanium polyside (a polysilicon layer and a titanium silicide layer) and includes the steps of a first step for anisotropically etching the titanium silicide layer using a plasma containing $Cl_2/N_2$ gas, and a second step for anisotropically etching the polysilicon layer using a plasma containing $Cl_2/O_2$.

17 Claims, 1 Drawing Sheet

DRY ETCHING METHOD FOR MULTILAYER FILM

BACKGROUND OF THE INVENTION

1. Field of the Invention

The present invention relates to a dry etching method for a multilayer film, and in particular to an improved dry etching method for a multilayer film which is capable of dry-etching a multilayer film such as a titanium polyside (a polysilicon layer and a titanium silicide layer).

2. Description of the Background Art

The polysilicon is generally used as a wiring member or a gate electrode for a known semiconductor device. As the semiconductor device has been developed to have a fineness and thinness characteristic, it is hard to use the polysilicon as a wiring member or a gate electrode. Therefore, a low resistance wiring member is needed for the fineness and thinness characteristic of the semiconductor device. As the low resistance wiring member, a tungsten polyside and a titanium polyside draw a big attention, which are formed by depositing a tungsten silicide or a titanium silicide on the polysilicon layer. Therefore, the dry etching method is intensively studied for the multilayer wiring such as a tungsten polyside or a titanium polyside.

The dry etching method for a known polyside multilayer wiring will be explained.

First, U.S. Pat. No. 5,160,407(IBM) disclose "a Low pressure anisotropic etch process for tantalum silicide or titanium silicide layer formed over polysilicon layer deposited on silicon oxide layer on semiconductor wafer" and a method for anisotropically etching a tantalum silicide layer or a titanium silicide layer.

In the above-described etching method, only $Cl_2$ gas is provided into a chamber in which a high frequency voltage is applied to one electrode and a ground voltage is connected with another electrode and a low pressure, for example about 10~30 mTorr, is applied to a tantalum silicide layer which is an upper most layer among the multilayer film or a titanium silicide layer and a part of the polysilicon layer, respectively, so that the tantalum silicide layer is etched therein. Next, the polysilicon layer remaining below the silicide layer is provided into the chamber and is etched by only HBr gas under the same pressure condition. At this time, the HBr gas plasma etching method will be explained. Since the etching selection ratios of the polysilicon layer and the silicon oxide film formed below the polysilicon layer are high, an over etching of the polysilicon layer may be made. In the known dry etching method for a multilayer film, there are provided a first step in which the anisotropic etching operation is performed based on $Cl_2$ gas and a second step in which the anisotropic etching operation is performed based on HBr gas.

Next, "Titanium silicide etching method based on $BCl_3$/$Cl_2$ gas (Applied Physics Associates of Japan, 1997, p607)" discloses an etching method for a titanium polyside. In the above-described method, the titanium polyside is etched using a reactive ion etching (RIE) apparatus and $BCL_3$/$Cl_2$, so that it is possible to obtain an etching selection ratio of 3 of the titanium silicide and the polysilicon layer, thus implementing a finesses processing and after the etching operation is performed, there is not formed any etching effects.

In addition, "TiSix etching in high density plasma (Applied Physics Associates of Japan, 1997, p630)" discloses an etching method for a multilayer film formed of a silicon oxide film/a polysilicon layer/a titanium silicide layer which is capable of reducing an under cut problem by increasing the amount of $N_2$ gas in the compound of $Cl_2$/$N_2$.

However, in the above-described multilayer etching method for a titanium silicide/polysilicon, it is difficult to obtain a vertical etch profile using $Cl_2$ gas when etching the titanium silicide.

In addition, when using the group of Br gas when etching the polysilicon, a bromide reaction product is not vaporized. Namely, the bromide reaction product remains on the surface of the wafer after the etching operation. Therefore, it is needed an additional process for removing the bromide reaction product.

Therefore, in the known multilayer etching method, since it is impossible to obtain a vertical etching profile, the reliability of the semiconductor device product is decreased, and since an additional process is required, the productivity of the semiconductor device is decreased.

SUMMARY OF THE INVENTION

Accordingly, it is an object of the present invention to provide a dry etching method for a multilayer film which overcomes the aforementioned problems encountered in the background art.

It is another object of the present invention to provide a dry etching method for a multilayer film which is capable of dry-etching a multilayer film such as a titanium polyside (a polysilicon layer and a titanium silicide layer).

To achieve the above objects, there is provided a dry etching method for a multilayer film which includes the steps of a first step for anisotropically etching the titanium silicide layer using a plasma containing $Cl_2$/$N_2$ gas, and a second step for anisotropically etching the polysilicon layer using a plasma containing $Cl_2$/$O_2$.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The dry etching method for a multilayer film according to the present invention will be explained with reference to the accompanying drawings.

Figure 1:
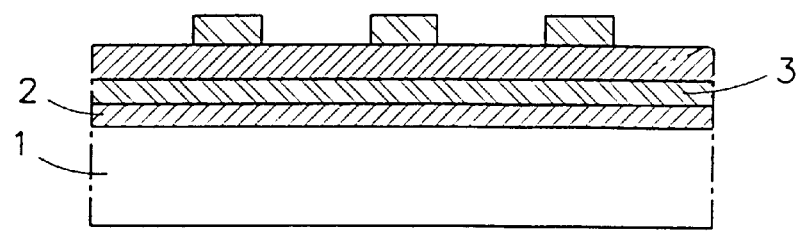
FIGS. 1 through 3 are cross-sectional views illustrating a dry etching method for a multilayer film according to the present invention.

First, as shown in FIG. 1, a silicon oxide film 2 and a polysilicon layer 3 are formed on a semiconductor substrate 1, and a titanium silicide layer 4 is formed on the polysilicon layer 3.

Figure 2:
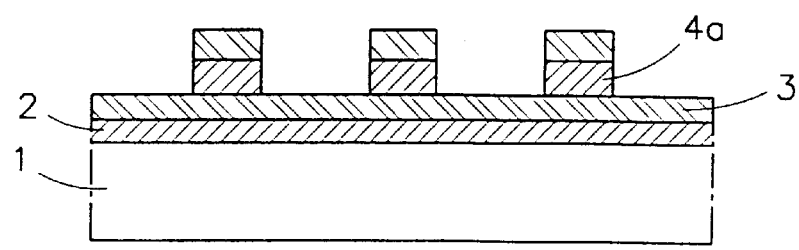

Thereafter, the semiconductor substrate is inserted into a chamber, so that a voltage (hereinafter called a bias voltage) is applied to one electrode of a chamber for controlling a bias, and a high frequency voltage (hereinafter called a source power) is applied to another electrode for generating a plasma. After the voltage is applied to two electrode in the chamber, a mixed gas of $Cl_2$/$N_2$ is flown into the chamber, and then the titanium silicide layer 4 is etched, so that a titanium silicide layer pattern 4a having a vertical etching profile as shown in FIG. 2 is formed.

Figure 3:
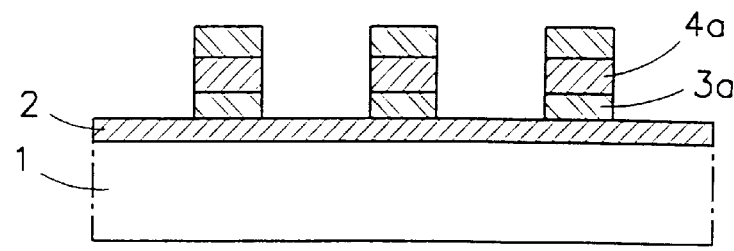

Next, the mixed gas of $Cl_2/O_2$ is flown into the chamber and the polysilicon layer 3 is etched, so that a polysilicon layer pattern 3a having a vertical etching profile as shown in FIG. 3 is formed. At this time, since any members do not remain on the surface of the semiconductor substrate 1, an additional cleaning process is not needed.

The operation of the dry etching method for a multilayer film according to the present invention will now be explained with reference to the accompanying drawings.

The dry etching method for a multilayer film according to the present invention is implemented by two processes. Among the processes, in a first process, the titanium silicide layer is etched using $Cl_2/N_2$ gas, and in a second process, the polysilicon layer is etched using $Cl_2/O_2$ gas.

In the first process, the $Cl_2/N_2$ gas is used for the reason that the plasma of the $Cl_2/N_2$ gas is generated in the chamber, and a reactive nitrogen ion is generated. Therefore, the reactive nitrogen ion is reacted and engaged with the titanium silicide, and a Ti—N and Si—N mixture are formed on the etching wall of the titanium silicide film, so that the etching lateral wall is protected from being etched by the plasma. Therefore, since the under cut problem does not occur, it is possible to obtain a vertical profile. At this time, $O_2$ is not provided for the reason that the oxygen plasma is engaged with the titanium for thereby generating $TiO_2$, and the thusly formed $TiO_2$ does not protect the etching lateral wall from the $Cl_2$ plasma for thus causing the under cut problem. In addition, in the present invention, the ratio of $Cl_2$ and $N_2$ in the mixed gas of $Cl_2/N_2$ is about 20:1 for thereby effectively forming a vertical profile.

In the second process, namely, the polysilicon layer etching process, the $Cl_2/O_2$ is used for the reason that since the etching selection ratio of the polysilicon layer and the silicon oxide film is high, it is possible to stably etch the polysilicon layer without damaging the silicon oxide film for thereby enabling an over etching, so that any members are not formed on the surface of the wafer after the etching operation is performed.

In the first and second processes, the reactive ion etcher (RIE), the magnetically enhanced reactive ion etcher (MERIE), and the high density plasma etcher are preferably used, which are capable of controlling the ion energy and the density of the plasma.

In particular, in the second process, when a helicon type etching apparatus is used as a high density plasma etching apparatus, the ratio of the oxygen gas with respect to the total gas amount is preferably 10%.

In addition, in the first process, if a helicon type etching apparatus is used as a high density plasma etching apparatus, the 100~2500 voltage (the source power) is preferably applied to one electrode to induce a plasma discharge. In addition, the 20~300 W bias voltage is preferably applied to the other electrode for controlling the bias voltage. In addition, if the helicon type etching apparatus is used, the pressure of the chamber is maintained at 20 mTorr, and the temperature is maintained at −10~50° C. for forming an optimum vertical lateral profile.

As described above, in the present invention, the anisotropical etching process is sequentially performed using $Cl_2/N_2$ gas and $Cl_2/O_2$ gas, so that it is possible to form a multilayer film without forming any members on the surface of the wafer, whereby the reliability of the semiconductor device and productivity are increased.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. In a dry etching method wherein there is provided a chamber in which a source voltage is applied to one electrode and a bias voltage is applied to another electrode, and a silicon oxide film is formed on a semiconductor substrate, and a polysilicon layer and a titanium silicide layer are sequentially formed on the silicon oxide film, the improved method comprising the steps of:

a first step for anisotropically etching the titanium silicide layer using a plasma containing $Cl_2/N_2$ gas wherein a temperature of the chamber is maintained at about −10 to about −50 degrees Celsius; and a second step for anisotropically etching the polysilicon layer using a plasma containing $Cl_2/O_2$.

2. The method of claim 1, wherein an etching apparatus used for the first and second steps is an apparatus capable of controlling an ion energy and a density of a plasma.

3. The method of claim 1, wherein an etching apparatus used for the first and second steps is one selected from the group consisting of a reactive etching apparatus, a magnetically enhanced reactive ion etching apparatus, and a high density plasma etching apparatus.

4. The method of claim 2, wherein an etching apparatus used for the first and second steps is one selected from the group consisting of a reactive etching apparatus, a magnetically enhanced reactive ion etching apparatus, and a high density plasma etching apparatus.

5. The method of claim 1, wherein an etching apparatus used for the second step is a helicon type etching apparatus in which the amount of oxygen is below approximately 10% compared to the entire gas amount.

6. The method of claim 1, wherein an etching apparatus used for the first step is a helicon type etching apparatus in which a source voltage applied into the chamber is approximately 100~2500 W.

7. The method of claim 1, wherein an etching apparatus used for the first step is a helicon type etching apparatus in which a bias voltage applied into the chamber is approximately 20~300 W.

8. The method of claim 1, wherein an etching apparatus used for the first step is a helicon type etching apparatus in which a pressure of the chamber is maintained below approximately 20 mTorr.

9. The method of claim 1, wherein an etching apparatus used for the first step is a helicon type etching apparatus.

10. A dry etching method for etching a substrate having a layer of titanium silicide or a layer of tungsten silicide formed on a layer of polysilicon, comprising the steps of:

a first step of anisotropically etching the silicide layer using a plasma containing $Cl_2/N_2$ gas; and a second step of anisotropically etching the polysilicon layer using a plasma containing only $Cl_2/O_2$ gas.

11. The method of claim 10, wherein an etching apparatus used for the first and second steps is capable of controlling an ion energy and a density of plasma.

12. The method of claim 10, wherein an etching apparatus used for the first and second steps is selected from the group consisting of a reactive ion etching apparatus, a magnetically enhanced reactive ion etching apparatus, and a high density plasma etching apparatus.

13. The method of claim 10, wherein an etching apparatus used for the second step is a helicon type etching apparatus, and wherein the concentration of oxygen is below approximately 10% during the second step.

14. The method of claim 10, wherein an etching apparatus used for the first step is a helicon type etching apparatus, and wherein a source voltage applied to a first electrode of the apparatus ranges from about 100 to 2500 W.

15. The method of claim 14, wherein an etching apparatus used for the first step is a helicon type etching apparatus, and wherein a bias voltage applied to a second electrode of the apparatus ranges from about 20 to 300 W.

16. The method of claim 10, wherein an etching apparatus used for the first step is a helicon type etching apparatus, and wherein a pressure of the apparatus is maintained below about 20 mTorr during the first step.

17. The method of claim 10, wherein an etching apparatus used for the first step is a helicon type etching apparatus, and wherein a temperature of the apparatus is maintained at about −10 to −50 degrees Celsius during the first step.

* * * * *